(12) United States Patent
Li

(10) Patent No.: US 8,984,449 B1
(45) Date of Patent: Mar. 17, 2015

(54) DYNAMICALLY GENERATING JOG PATCHES FOR JOG VIOLATIONS

(71) Applicant: Oracle International Corporation, Redwood Shores, CA (US)

(72) Inventor: Mu-Jing Li, Sunnyvale, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/027,329

(22) Filed: Sep. 16, 2013

(51) Int. Cl.
*G06F 17/50* (2006.01)

(52) U.S. Cl.
CPC .................................. *G06F 17/50* (2013.01)
USPC .............. 716/52; 716/50; 716/51; 716/53; 716/54; 716/55; 430/5; 430/30

(58) Field of Classification Search
CPC . G06F 17/5081; G06F 2217/12; G06F 17/50; G06F 17/5068; G03F 1/144; G03F 1/36; G03F 7/70441
USPC ............. 716/50–56, 106, 112, 139; 430/5, 30
See application file for complete search history.

(56) References Cited

U.S. PATENT DOCUMENTS

| | | | |
|---|---|---|---|
| 6,499,135 B1 | 12/2002 | Li et al. | |
| 6,536,023 B1 * | 3/2003 | Mohan et al. | 716/112 |
| 6,608,335 B2 | 8/2003 | Dixit et al. | |
| 6,637,013 B1 | 10/2003 | Li | |
| 6,718,527 B2 | 4/2004 | Li | |
| 6,735,749 B2 | 5/2004 | Li et al. | |
| 6,769,099 B2 | 7/2004 | Li et al. | |
| 6,772,401 B2 * | 8/2004 | Li | 716/112 |
| 6,775,806 B2 | 8/2004 | Li | |
| 6,792,586 B2 | 9/2004 | Li | |
| 6,804,808 B2 | 10/2004 | Li et al. | |
| 6,816,998 B2 | 11/2004 | Li | |
| 6,832,360 B2 | 12/2004 | Li | |
| 6,871,332 B2 | 3/2005 | Li et al. | |
| 6,883,149 B2 | 4/2005 | Li et al. | |
| 6,892,363 B2 | 5/2005 | Li | |
| 6,892,368 B2 * | 5/2005 | Li et al. | 716/112 |
| 6,895,568 B2 | 5/2005 | Li | |
| 6,915,252 B1 | 7/2005 | Li | |
| 7,007,258 B2 | 2/2006 | Li | |
| 7,096,447 B1 | 8/2006 | Li et al. | |
| 7,380,227 B1 * | 5/2008 | Li | 716/112 |
| 7,519,929 B2 | 4/2009 | Li | |
| 8,117,581 B1 | 2/2012 | Li | |
| 8,423,943 B2 | 4/2013 | Li | |
| 2002/0185664 A1 | 12/2002 | Dixit et al. | |
| 2003/0061583 A1 * | 3/2003 | Malhotra | 716/5 |
| 2003/0182644 A1 | 9/2003 | Li et al. | |
| 2003/0196180 A1 | 10/2003 | Li et al. | |
| 2003/0229860 A1 | 12/2003 | Li | |
| 2003/0229862 A1 * | 12/2003 | Li et al. | 716/1 |
| 2004/0019861 A1 | 1/2004 | Li | |
| 2004/0019862 A1 | 1/2004 | Li et al. | |

(Continued)

*Primary Examiner* — Nha Nguyen

(74) *Attorney, Agent, or Firm* — Kraguljac Law Group, LLC

(57) ABSTRACT

Systems, methods, and other embodiments associated with dynamically generating jog patches are described. In one embodiment, a method includes determining a virtual edge within metal of a design at a jog rule violation. The design is a design of an integrated circuit and the virtual edge is an edge of a rectangle associated with one or more edges of the jog rule violation. The example method may also include dynamically generating a jog patch by expanding the metal from the virtual edge.

20 Claims, 14 Drawing Sheets

(56) References Cited

U.S. PATENT DOCUMENTS

| | | |
|---|---|---|
| 2004/0019866 A1 | 1/2004 | Li |
| 2004/0019867 A1 | 1/2004 | Li |
| 2004/0019868 A1 | 1/2004 | Li |
| 2004/0025125 A1 | 2/2004 | Li |
| 2004/0063228 A1 | 4/2004 | Li et al. |
| 2004/0064795 A1 | 4/2004 | Li et al. |
| 2004/0064796 A1 | 4/2004 | Li |
| 2004/0064797 A1 | 4/2004 | Li |
| 2004/0255258 A1 | 12/2004 | Li |
| 2006/0085773 A1* | 4/2006 | Zhang ............... 716/4 |
| 2007/0300195 A1 | 12/2007 | Li |
| 2009/0007053 A1* | 1/2009 | Kim ............... 716/21 |
| 2009/0241087 A1* | 9/2009 | Zhang et al. ............... 716/21 |
| 2012/0110534 A1 | 5/2012 | Li |
| 2013/0091478 A1 | 4/2013 | Li et al. |
| 2014/0033143 A1* | 1/2014 | Kim ............... 716/53 |

\* cited by examiner

DYNAMICALLY GENERATING JOG PATCHES FOR JOG VIOLATIONS

BACKGROUND

Designing integrated circuits is a complicated and time consuming task. Before an integrated circuit is manufactured many different design and validation processes for the integrated circuit occur. For example, in general, designing an integrated circuits begins with defining design specifications, implementing the design electronically using a high level programming language (e.g., VHDL or other hardware description language), and simulating the design to determine functional difficulties.

Once the integrated circuit is implemented and simulated, a design for the integrated circuit is created. The design is essentially a schematic of the integrated circuit. The design describes a detailed layout and positioning of metal geometries within and between layers of the integrated circuit. Generating the design is a very intensive and time-consuming effort and is generally performed using computer aided design (CAD) tools and/or electronic design automation (EDA) tools.

Additionally, from the design different checks/validations can be performed that ensure proper manufacturing. For example, design rule checks (DRCs) are a set of design rules that ensure a lower probability of fabrication defects. The DRCs specify different constraints such as a minimum spacing between metal geometries and different acceptable metal geometries that avoid the fabrication defects. Correcting the DRCs often includes manually manipulating the design to change metal geometries for identified violations. However, because EDA tools do not prevent violations of the design rules from being generated, a design often includes thousands of violations that must be corrected. Accordingly, checking for DRC violations and manipulating a design to correct the DRC violations can be a time consuming process.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
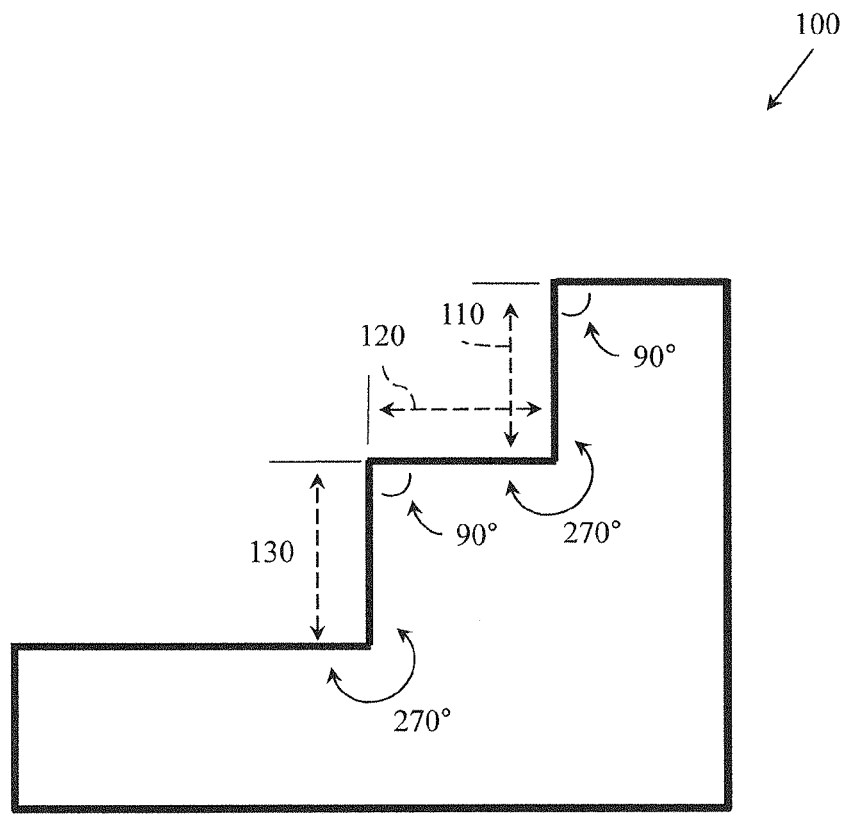
FIG. 1 illustrates one example of a metal geometry with jog violations.

Systems, methods and other embodiments are described herein that are associated with dynamically generating jog patches to correct jog violations in an integrated circuit design. Consider that an integrated circuit includes many different layers that form transistors, capacitors, resistors, wires, interconnects, bonding sites, insulating layers, and so on. Accordingly, a design of the integrated circuit is complex. The different layers are typically segmented into two groups, front end of line (FEOL) layers and back end of line (BEOL) layers. In general, the FEOL layers are fabricated first and include, for example, transistors (e.g., CMOS), resistors, and/or capacitors. The BEOL layers are fabricated on top of the FEOL layers. The BEOL layers (also referred to as the metal layers) are designed to include wires, also referred to as metal routes that interconnect elements of the FEOL layers. That is, the BEOL layers connect elements of the FEOL layers to form circuits.

The BEOL layers typically include multiple layers of wire routes/interconnects. Additionally, connections between layers are made using vias to connect metal routes of one layer with metal routes of another layer. Because connection points for vias can be wider than metal routes in a layer, jog/zigzag geometries in metal edges can occur at connection points between vias and the metal routes. The jog geometries in the metal can also occur where the metal routes are turned several times in a short space to, for example, avoid another route or structure.

The jog geometries can cause difficulties when manufacturing the integrated circuit if edges of the jogs are smaller than a certain size. Thus, when consecutive edges of a jog are less than a certain size, the jog is referred to as a jog violation or jog rule violation. As used within this disclosure, a jog violation is a design rule check (DRC) error that occurs when two consecutive edges of metal in a layer of an integrated circuit design satisfy a set of conditions. The set of conditions may vary depending on specific design constraints, but, in general, the set of conditions include a first edge being less than a first predefined length and a second edge being less than a second predefined length. The first predefined length may be a width of a metal route used in the integrated circuit while the second predefined length is typically slightly larger than the first predefined length. For example, the metal route width may be a minimum design width (e.g., 20 nm, 90 nm, and so on). A DRC error results from the short edges of a jog violation because a resulting geometry in the metal is, for example, often difficult to fabricate without imperfections.

Furthermore, as previously mentioned, a design tool such as an electronic design automation (EDA) tool is used to design (e.g., place components, route wires, and so on) the integrated circuit due to the complexity and scale of the design. Additionally, while the EDA tool can be configured to account for various problems and avoid designs that violate rules (e.g., design rule checking (DRC)), the EDA tools are inefficient at avoiding and at correcting jog violations.

Consider that several different types of jog violations may exist in a design. For example, the jog violations may include concave and/or convex jog violations. Additionally, lengths of edges and surrounding metal geometries may also differ, which further complicates the design. FIG. 1 illustrates two examples of jog violations. In FIG. 1, a bounded region of metal 100 (solid area of metal) represents a metal geometry in a design of an integrated circuit (i.e., a small region within a single layer). Edges 110 and 120 are consecutive edges in a perimeter of the metal 100 that form a concave jog violation. A concave jog is defined by internal angles of 90°/270°/90° in the metal 100 that surround the edges 110 and 120. A concave jog violation occurs when a concave jog includes two consecutive edges that violate predefined lengths. The two edges of the concave jog violation form a recessed corner in the metal 100 at the 270° internal angle.

Continuing with FIG. 1, edges 120 and 130 are consecutive edges of the metal 100 that form a convex jog violation. The convex jog violation is defined by consecutive internal angles of 270°/90°/270° in the metal 100 surrounding the edges 120 and 130. The two consecutive edges 120 and 130 meet at a 90° internal angle of the metal 100. The convex jog violation forms an extending corner of the metal 100 that juts outward.

The jog violations can take many different forms especially when considering varying lengths of edges and surrounding geometries that may be spatially close to the jog violations. Thus, when an EDA tool attempts to correct a jog violation using, for example, predefined patches, several different patches may need to be iteratively applied and analyzed before finding a patch that corrects the violation and does not cause additional DRC errors. However, correcting the jog violations in this way is time intensive and reduces efficiency of the EDA tool for large designs. Additionally, none of the predefined patches may even correct the jog violation without causing additional DRC errors.

Accordingly, in one embodiment, jog patches are dynamically generated for each jog violation. In this way, a dynamically generated jog patch is more likely to correct the jog violation without causing additional DRC errors and without iteratively attempting different patches. Thus, improved efficiency is achieved by dynamically generating jog patches for fixing jog violations in the same process (i.e., in one iteration of executing a process).

Figure 2:
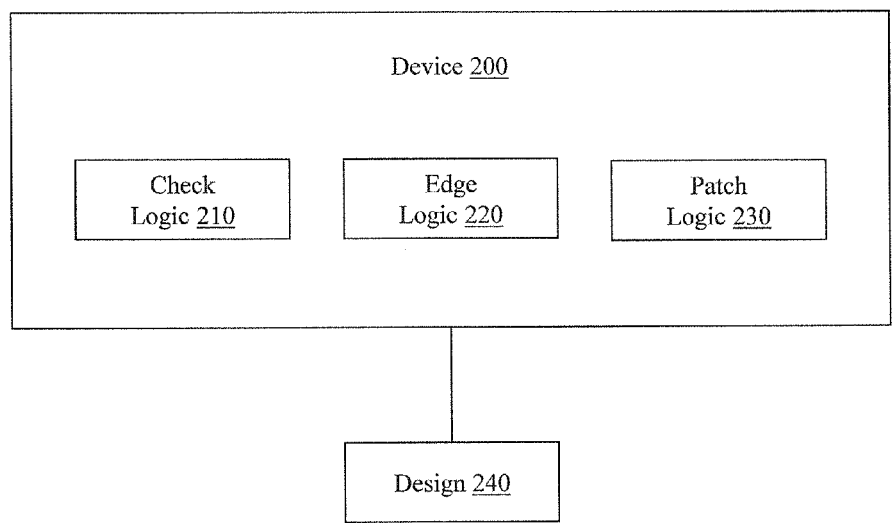
FIG. 2 illustrates one embodiment of a device associated with dynamically generating jog patches.

With reference to FIG. 2, one embodiment of a device 200 associated with dynamically generating jog patches to correct jog violations in an integrated circuit design is illustrated. The device 200 includes a check logic 210, an edge logic 220 and a patch logic 230. The device 200 is, for example, a computer or other device that interacts with a design 240 of an integrated circuit. In one embodiment, the device 200 is configured to execute an EDA tool or other tool (e.g., Calibre®) that assists a user in producing the design 240. Accordingly, in one embodiment, the device 200 includes at least a processor (not shown) for executing instructions associated with the tool(s).

The design 240 is a design of an integrated circuit that includes, for example, a plurality of metal geometries that form connections between different components of the integrated circuit. The design 240 is, for example, embodied locally within the device 200 or remotely within a separate storage medium. In either case, the device 200 is configured to access and manipulate the design 240.

Accordingly, the check logic 210 is configured to identify DRC violations/errors in the design 240 including the jog rule violations. While the DRC violations are discussed as including jog rule violations, of course, in general the DRC violations may also include, for example, metal spacing violations and metal geometry violations such as jog violations, metal slivers, metal notches, and so on. Thus, in one embodiment, the check logic 210 is configured to iteratively check consecutive edges of the metal in the design 240 to determine whether any two consecutive edges violate a set of predefined conditions for causing a jog rule violation. When the check logic 210 discovers two consecutive edges that meet conditions for a jog rule violation, the edges are, for example, marked or otherwise logged so that the offending edges can be corrected.

For each of the jog violations identified by the check logic 210, the edge logic 220 determines a virtual edge for generating a jog patch. Determining virtual edges for dynamically generating jog patches will be discussed in greater detail with reference to method 300 of FIG. 3. However, in general, a virtual edge is a construct/reference within metal of the design 240 that the device 200 uses to determine how to generate a jog patch for a jog violation. That is, the virtual edge provides a construction reference edge/line. The virtual edge is, for example, not a real edge of the metal but is instead a line that is within the metal and is used as a reference to construct the jog patch. The device 200 can use the virtual edge to generate a jog patch in such a way that the jog patch generated from the virtual edge will correct the jog violation.

For example, the patch logic 230 is configured to dynamically generate a jog patch from the virtual edge. Just as with determining the virtual edge, generating the jog patch will be discussed in greater detail with reference to FIG. 3 and method 300. However, in general, the patch logic 230 expands the metal around the jog violation starting at the virtual edge to correct the jog violation. Expanding the metal, in this way, absorbs the jog violation by changing a length of at least one of the edges that cause the jog violation. Thus, a jog patch that corrects the jog violation is dynamically generated instead of iteratively attempting to correct the jog violation with different predefined jog patches.

Additionally, the patch logic 230 uses the jog patch to transform metal in the design so that the jog violation is resolved/corrected and no longer exists. That is, the jog patch will not generate any new DRC errors, then the patch logic 230 manipulates the design to include the jog patch by adding additional metal in the design at the jog patch. In this way, jog violations are dynamically generated and applied to the design to correct jog violations in a single process without iteratively applying predefined jog patches.

Figure 3:
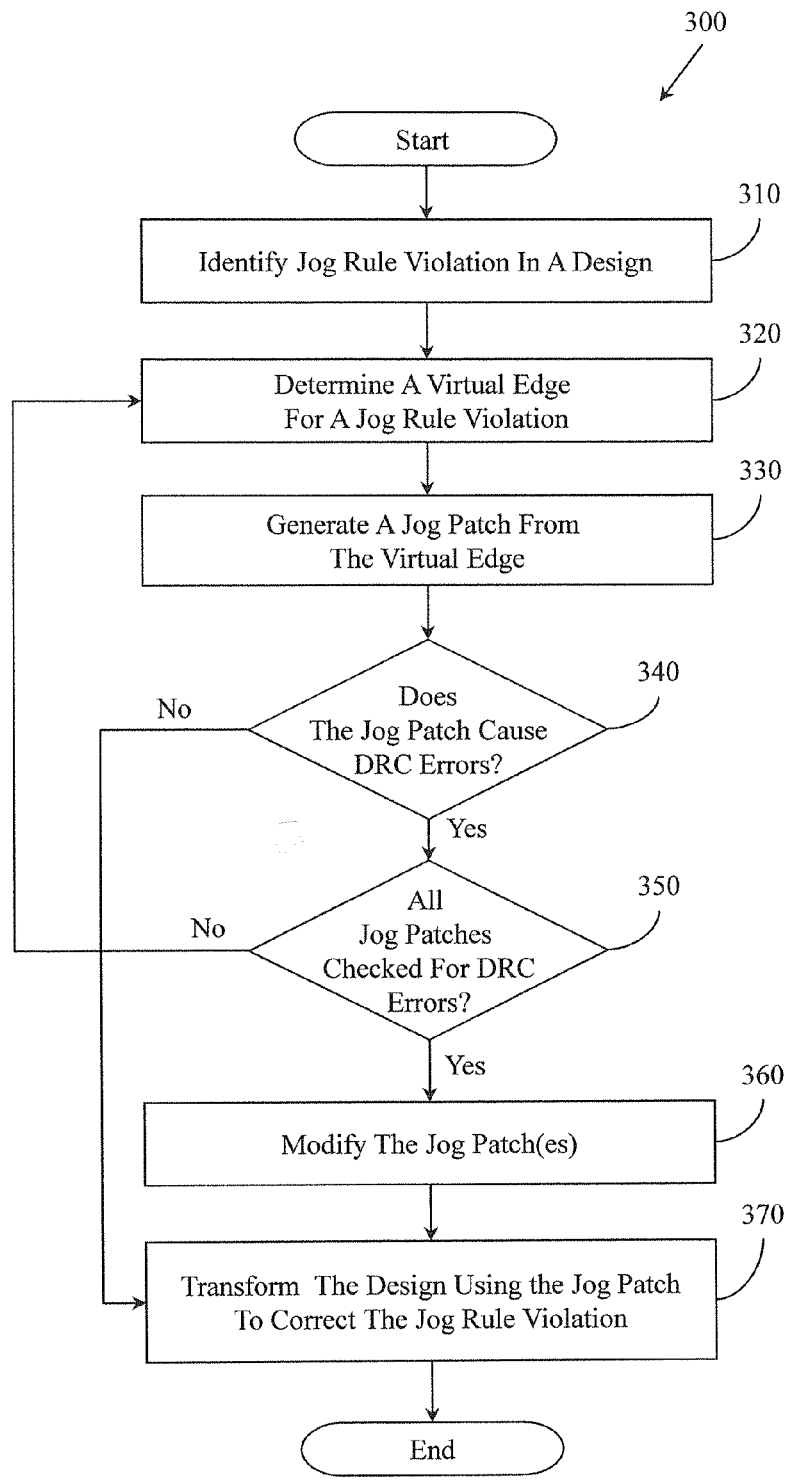
FIG. 3 illustrates one embodiment of a method associated with dynamically generating jog patches.

Further details of determining the virtual edge and generating the jog patch will now be discussed with reference to FIG. 3. FIG. 3 illustrates a method 300 associated with dynamically generating jog patches to correct jog violations in an integrated circuit design. FIG. 3 will be discussed from the perspective of a device that is configured to analyze and modify a design (e.g., design 240) of an integrated circuit. That is, the device is configured to execute one or more design tools (e.g., an EDA tool) that are configured to perform the method 300. Additionally, FIG. 3 will be discussed along with FIGS. 4-13, which illustrate exemplary metal geometries with jog violations.

At 310, a design is analyzed to identify jog rule violations. As discussed with respect to FIG. 1, jog violations occur when two consecutive metal edges are less than a set of predefined lengths. More specifically, when a first edge is less than a first predefined length and a second edge is less than a second predefined length, the edges then define a jog violation. In general, the first predefined length is less than the second predefined length. In one embodiment, the first predefined length is, for example, 0.045 μm and the second predefined length is 0.059 μm. In one embodiment, convex jog rule violations are defined by a second predefined length of 0.059 μm while concave jog rule violations are defined by a second predefined length of 0.108 μm. Of course, other conditions can be defined as a jog violation.

Thus, in one embodiment, at 310, the device analyzes the design to identify all edges that are shorter than the first predefined length and all edges that are shorter than the second predefined length. When an edge is less than the first or second predefined length, then the edge is, for example, marked or logged according to a length of the edge (i.e., less than the first or less than the second). From the marked edges the device can then identify jog violations.

In one embodiment, the device iteratively checks consecutive edges by 1) identifying an edge that is less than the first predefined length, and 2) determining whether a second edge that is consecutive with first edge (i.e., either of two edges that meet the first edge) is less than at least the second predefined length. If either edge is less than the second predefined length then a jog violation exists at the two consecutive edges. As used within this disclosure, "consecutive edges" are edges that meet at a corner where an internal angle of the metal is either 270° or 90°. Additionally, internal angles of the metal in the design around the first edge and the second edge are either 270°/90°/270° or 90°/270°/90° for a jog violation to occur. In this way, the consecutive edges form either a concave or convex corner.

Furthermore, identifying the jog violations, at 310, also includes identifying a type for each of the jog rule violations. For example, the device determines whether each of the jog rule violations is convex or concave. Because concave and convex jog violations each have slightly different characteristics, jog patches for convex and concave violations are determined differently. Thus, the device determines a type of the jog violation by determining a configuration of surrounding internal angles of the metal as mentioned previously.

EXAMPLE

Virtual Edges for Concave Jog Violations

At 320, a virtual edge within the metal of the design is determined for a jog violation. For purposes of this discussion a single jog violation will be discussed. However, in general, method 300 includes identifying a plurality of jog violations and determining virtual edges for the plurality of jog violations. For example, in one embodiment, method 300 may identify and determine virtual edges for many jog violations in parallel.

In either case, determining a virtual edge for the jog violation occurs according to a type of the jog violation (i.e., concave or convex). Thus, determining a virtual edge for dynamically generating a jog patch for a concave jog violation will be discussed first followed by a discussion of virtual edges for convex jog violations.

Figure 4:
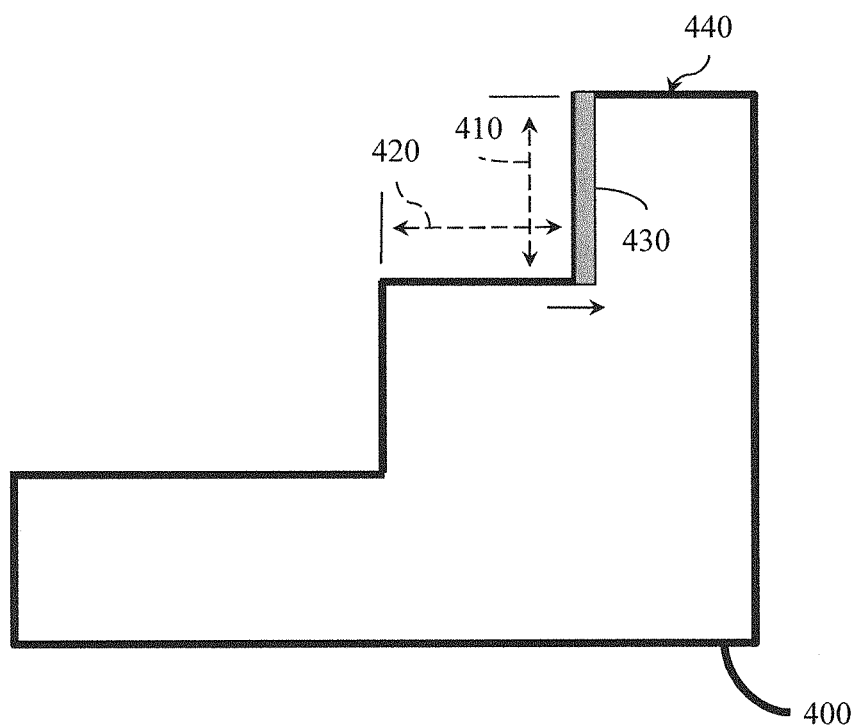
FIGS. 4-13 illustrate examples of metal geometries with various jog rule violations.

With reference to FIG. 4, one example of a metal geometry 400 is illustrated along with edges 410 and 420 that form a concave jog violation. To initiate determining a virtual edge, at 320, one of the edges 410 or 420 is first selected. In general, whichever edge is in a routing direction of the metal is initially selected. A routing direction is a direction in which metal wires/routes are placed when designing a layer. For example, in FIG. 4, edge 420 is a part of a metal notch and is perpendicular to a routing direction while edge 410 is part of a metal route and is parallel to the routing direction. This is because, for example, the notch is part of a via while the metal route is part of a placed metal route in the layer.

Accordingly, at 320, the device selects edge 410, which is parallel with a routing direction. The edge 410 is then expanded to within the metal 400 to generate a marker box 430 as indicated by the arrow. The marker box 430 is a reference box within the metal 400 that permits the device to locate an abutting edge 440. In general, the device expands the edge 410 within the metal 400 by, for example, one-tenth of one design grid. In general, the design is referenced against a design grid in order to precisely locate wires and components within the design. Accordingly, while expanding the edge 410 is discussed as occurring by a specific amount of a design gird, of course, in other embodiments the amount may be more or less.

In either case, for example, the edge 410 is expanded by an arbitrary amount within the metal 400 in order to locate the abutting edge 440. The amount by which the edge 410 is expanded to generate the marker box 430 only needs to be enough to locate the abutting edge 440 and thus does not need to occupy a complete inner area of the metal 400 or surpass an opposite side of the metal 400.

Figure 5:
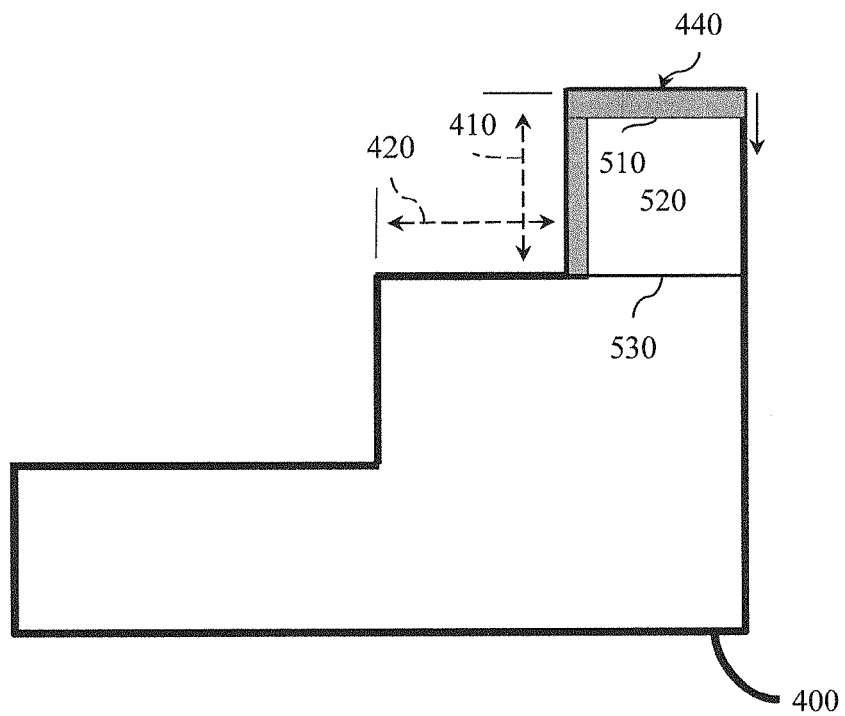

The abutting edge 440 is an edge of the metal 400 that is consecutive with and perpendicular to the edge 410, but the abutting edge is not part of the jog violation that is formed by the edges 410 and 420. FIG. 5 illustrates the metal 400 and how the device proceeds with the method 300 proceeds once the abutting edge 440 has been determined. Accordingly, the device expands the abutting edge 440 within the metal 400 to form another marker box 510. Similar to expanding the edge 410, expanding the abutting edge 440 occurs by an arbitrary amount, but is, in general, one-tenth of a design grid. In one embodiment, the device uses the marker box 510 to determine an extent of the abutting edge 440 and an orientation of the metal 400 in order to then determine a bounding box 520 from the marker box 430 and the marker box 510.

After the abutting edge has been expanded, the device creates the bounding box 520 in the metal 400 of the design. The bounding box 520 is a rectangle that is created from the edge 410 and the abutting edge 440 according to principals of geometry. Consider that a rectangle is a four sided polygon with two sets of parallel sides that meet at right angles. Accordingly, because two consecutive edges (e.g., 410 and 440) of the rectangle that form the bounding box 520 are known, the bounding box 520 can be created from the edge 410 and the abutting edge 440.

Once the bounding box 520 has been formed, a virtual edge 530 is determined from the bounding box 520. In one embodiment, the device determines the virtual edge 530 by identifying an edge of the bounding box 520 that is opposite to the abutting edge 440. Additionally, in one embodiment, the device determines the virtual edge 530 by determining which edge of the bounding box is completely enclosed within the metal 400.

EXAMPLE

Virtual Edges for Convex Jog Violations

Figure 6:
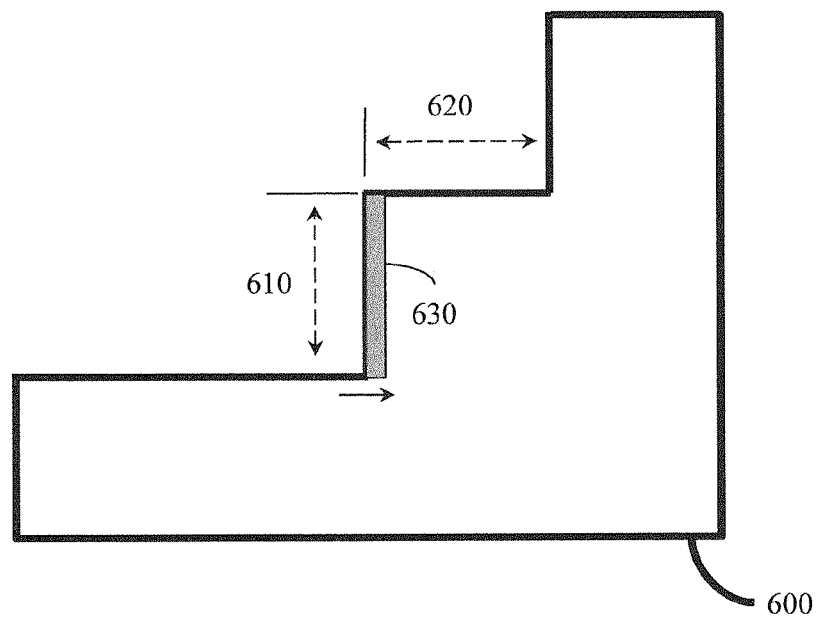

Alternatively, at 320, if the jog violation is convex, then no abutting edge is identified to determine a virtual edge as with a concave jog violation. For example, FIG. 6 illustrates one example of a metal geometry 600 with edges 610 and 620 that form a convex jog violation. To initiate determining a virtual edge, at 320, one of the edges 610 or 620 is first selected. In general, whichever edge is in a routing direction of the metal 600 is initially selected.

Figure 7:
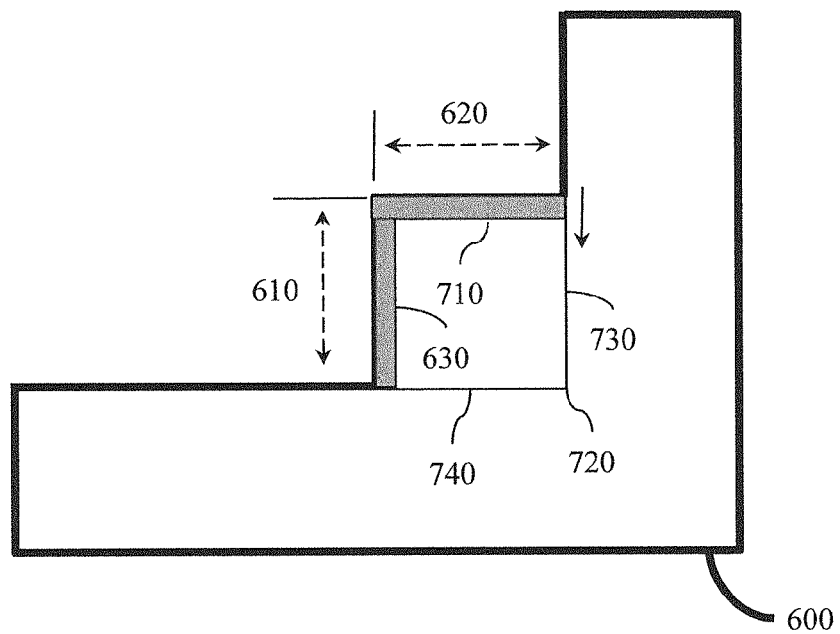

Accordingly, at 320, the device selects edge 610, which is oriented in a routing direction, and then expands the edge 610 to within the metal 600 to generate a marker box 630. Similar to the edge 410 and the edge 440 of FIG. 4, the edge 610 is expanded by an arbitrary amount, which is, in general, one-tenth of a design grid to form the marker box 630. As shown in FIG. 7, the edge 620 is then expanded within the metal 600 in a similar fashion to form a marker box 710. The device then uses the marker boxes 630 and 710 as references along with the edges 610 and 620 to define a bounding box 720. The bounding box 720 is defined in a similar manner as the bounding box 510 of FIG. 5.

Once the bounding box 720 has been defined, two virtual edges 730 and 740 are determined from edges of the bounding box 720. The virtual edges 730 and 740 are not edges of the jog violation, but are instead internal references edges within the metal 600. The virtual edges 730 and 740 may then be subsequently used to generate jog patches.

At 330 of method 300, a jog patch is dynamically generated for a jog violation using a previously defined virtual edge. In one embodiment, dynamically generating the jog patch includes generating the jog patch in real-time as part of correcting a plurality of jog violations and without iteratively executing a process. That is, the device does not use predefined jog patches but instead generates a jog patch that is specific to a jog violation by using a virtual edge.

Figure 8:
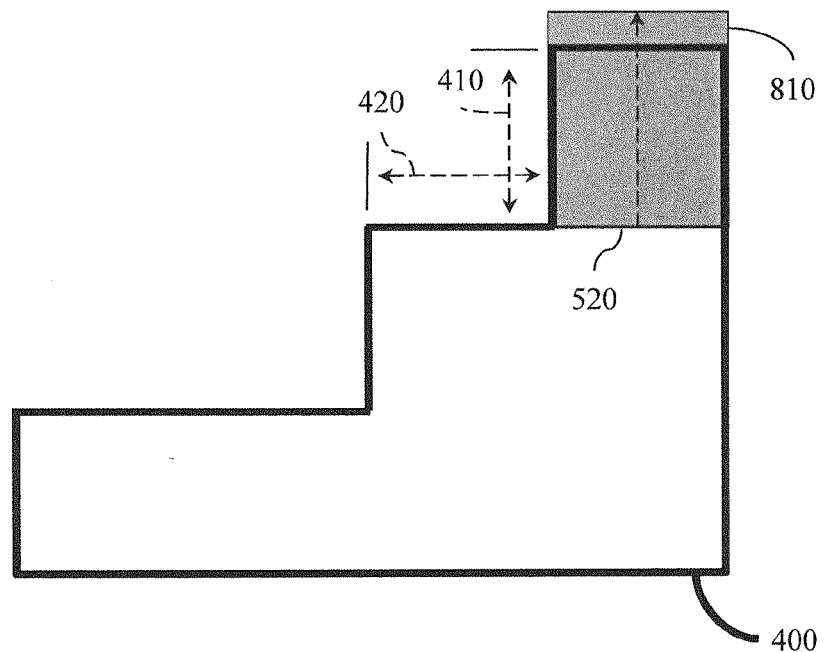

For example, consider FIG. 8, which illustrates the metal 400 from FIGS. 4-5 along with the virtual edge 520. At 330, the device expands a construction box (i.e., a rectangle with the virtual edge 520 as one side) from the virtual edge 520. In one embodiment, the device expands the virtual edge 520 in the routing direction and by the second predefined length. As discussed previously with block 310 of method 300, the second predefined length is a length used for determining whether a second edge that is consecutive with a first edge satisfies a condition for a jog rule violation to exist.

While the device may be configured to always expand the virtual edge by the second predefined length, in another embodiment, the device expands the virtual edge 520 by either the first predefined length or the second predefined length according to which edge is coincident (i.e., an edge that is less than the first predefined length or an edge that is less than the second predefined length) with the jog patch 810 and a length of the second edge 420.

That is, for example, if the edge 410 is greater than the first predefined length but is less than the second predefined length, then the virtual edge 520 is expanded by the second predefined length. In this way, the edge 410 would no longer be less than the second predefined length since the edge 410 is extended by the jog patch 810 adding metal. However, if the edge 410 is less than the first predefined length and the second edge is not less than the first predefined length, then the virtual edge is expanded by the first predefined length. In this way, the first edge 410 is then not less than the first predefined length and conditions for the jog violation no longer exist since neither of the edges 410 and 420 are then not less than the first predefined length. Furthermore, if both the first edge 410 and the second edge 420 are less than the first predefined length, then the virtual edge 520 is expanded by the second predefined length to form the jog patch 810 and to avoid satisfying conditions of the jog violation.

It should be noted that while the jog patch 810 is discussed as adding metal to the design, metal is added only to extent which metal was already not previously in place. That is, metal is added that correlates to the jog patch 810 only for an extent of the jog patch 810 that extends beyond an original footprint of the metal 400.

Figure 9:
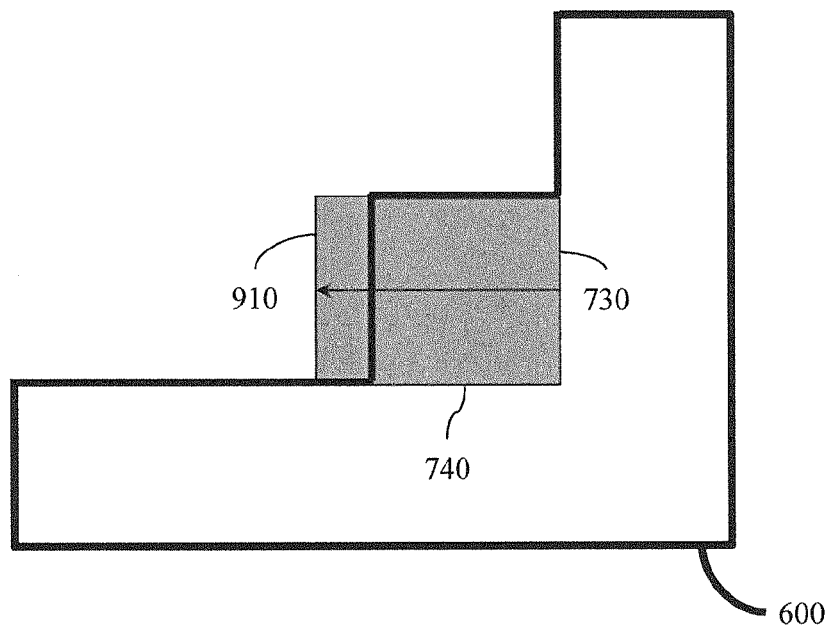
Figure 10:
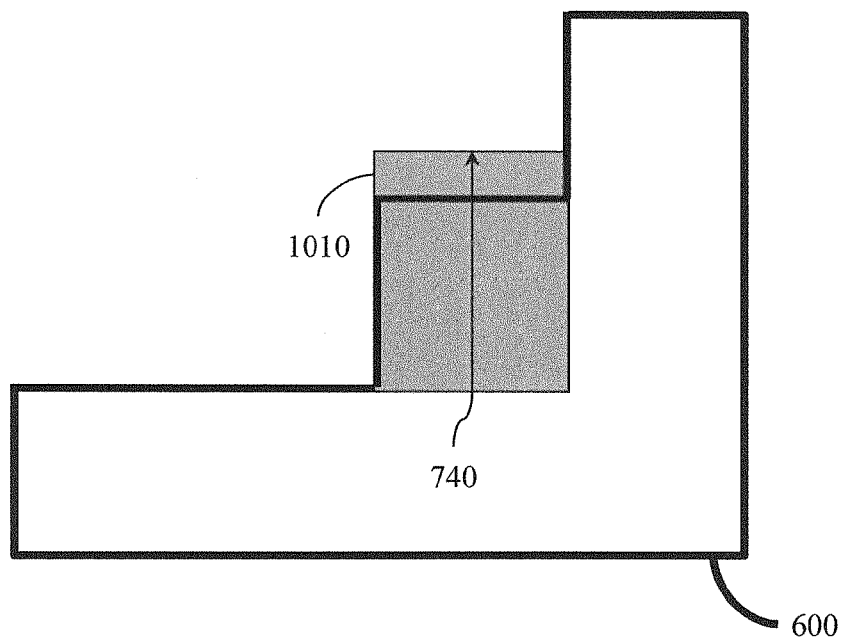

Dynamically generating a jog patch, at 330 of method 300, for a convex jog violation will now be discussed with reference to FIGS. 9 and 10. FIG. 9 illustrates the metal 600 from FIGS. 6-7 and the virtual edges 730 and 740. In one embodiment, for convex jog violations virtual edges that are perpendicular to a routing direction of the metal 600 are expanded to dynamically form jog patches. Thus, for convex jog violations two jog patches are, for example, formed of which one is later selected to apply to the metal 600. For example, in FIG. 9, the virtual edge 730 is expanded in a similar manner as the virtual edge 520 from FIG. 8. Expanding the virtual edge 730 forms a jog patch 910. Additionally, as discussed in relation to FIG. 8, in one embodiment, an amount for extending the virtual edge 730 is generically the second predefined length.

In another embodiment, the amount by which the virtual edge 730 is expanded is based, at least in part, on a length of an edge (e.g., 620) of the jog violation that is parallel to the direction of expansion and also a length of a remaining edge of the jog violation (e.g., 610). Accordingly, the virtual edge 730 may be expanded by the first or the second predefined length. In either case, the amount by which the edge is extended nullifies the jog violation. Additionally, in FIG. 10, the virtual edge 740 is expanded in a similar manner to form a jog patch 1010. Accordingly, for a convex jog violation two jog patches may be generated.

Figure 11:
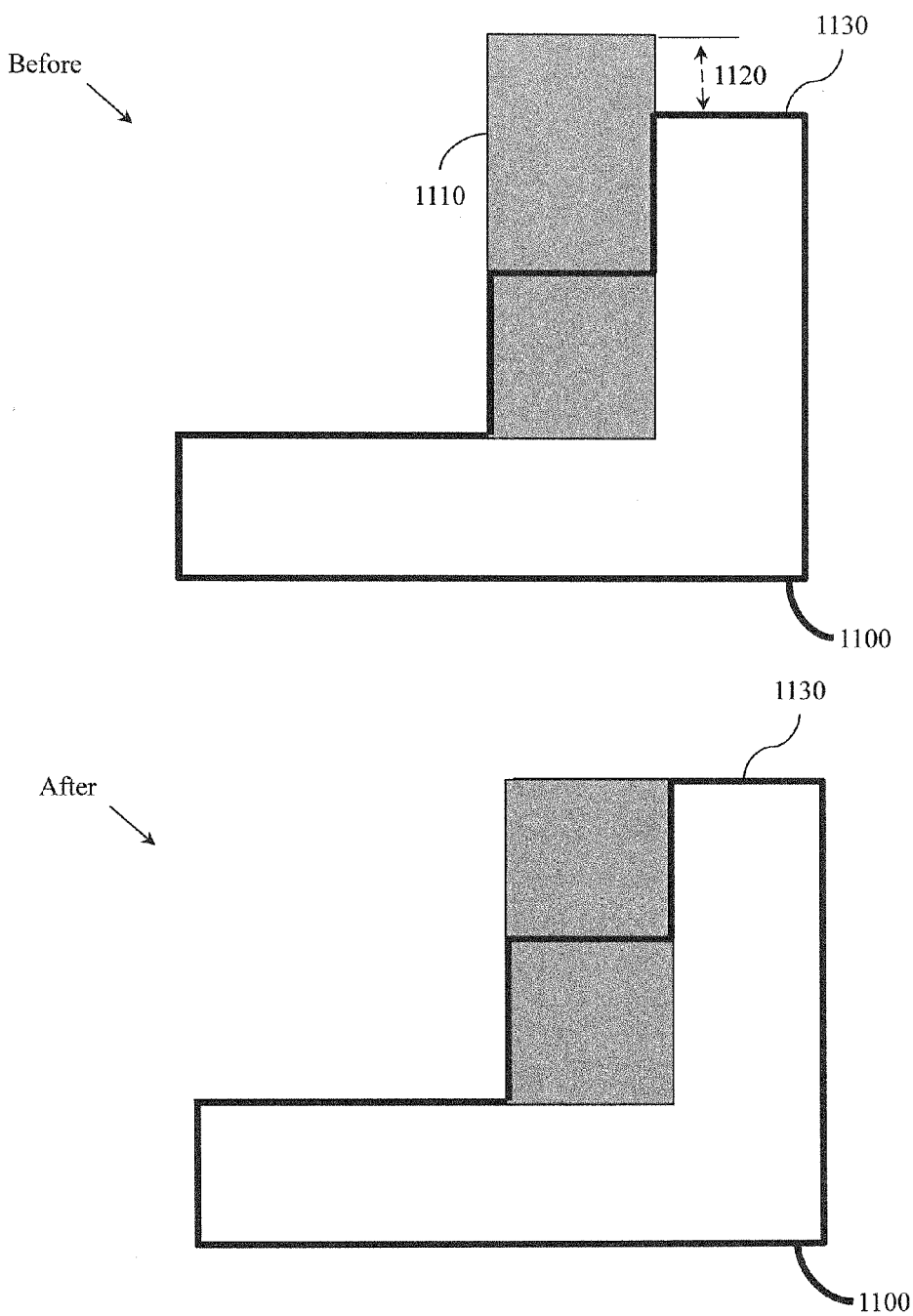

Continuing with method 300 at 340, the device determines whether the jog patch causes a new DRC error. Determining whether a jog patch causes a new DRC error occurs in a similar manner for both convex and concave jog patches. Additionally, in the case of the convex jog patches, both jog patches may be checked to determine whether either of the jog patches 730 and 740 cause a DRC error. For example, expanding the metal beyond the original extent of the bounded region (e.g., 400 and 600) may cause the metal to infringe on a gap between the metal and another nearby metal route or structure. Accordingly, expanding the metal using the jog patch may result in a metal spacing violation where the patch extends the metal to become too close to other metal (not shown). Furthermore, expanding the metal using a jog patch may cause a new jog violation as shown in FIGS. 11-13.

Thus, if a jog patch results in a new DRC error, then either a new jog patch is generated or the jog patch is modified. For example, in the case of the convex jog patches 730 and 740, if one of the patches causes an error then the other is selected. Additionally, in the case of the concave jog patch 810, if the jog patch 810 causes a DRC error then, in one embodiment, a new jog patch is generated by, for example, proceeding to select a different virtual edge, at 320. At 320, a new edge is selected according to an edge that is perpendicular to the routing direction for determining a virtual edge. In this way, another jog patch can be generated, at 330, that expands the metal in a different direction that may not cause a new DRC error.

However, at 350, if no jog patch can be generated that avoids new DRC errors, then an existing jog patch is modified at 360. For example, consider FIGS. 11-13, which illustrate various metal geometries with jog patches that have been generated to correct jog violations. FIG. 11 illustrates a bounded region of metal 1100 with a jog patch 1110. The jog patch 1110 extends by a portion 1120 beyond an edge 1130, which causes either an additional jog violation or a minimum width violation at the edge 1130 depending on exactly how the extension beyond the edge 1130 occurs. Accordingly, at 360, the extra portion 1120 of the jog patch 1110 is removed to make the jog patch 1110 even with the edge 1130. In this way, the new DRC error is avoided while still patching the jog violation.

Figure 12:
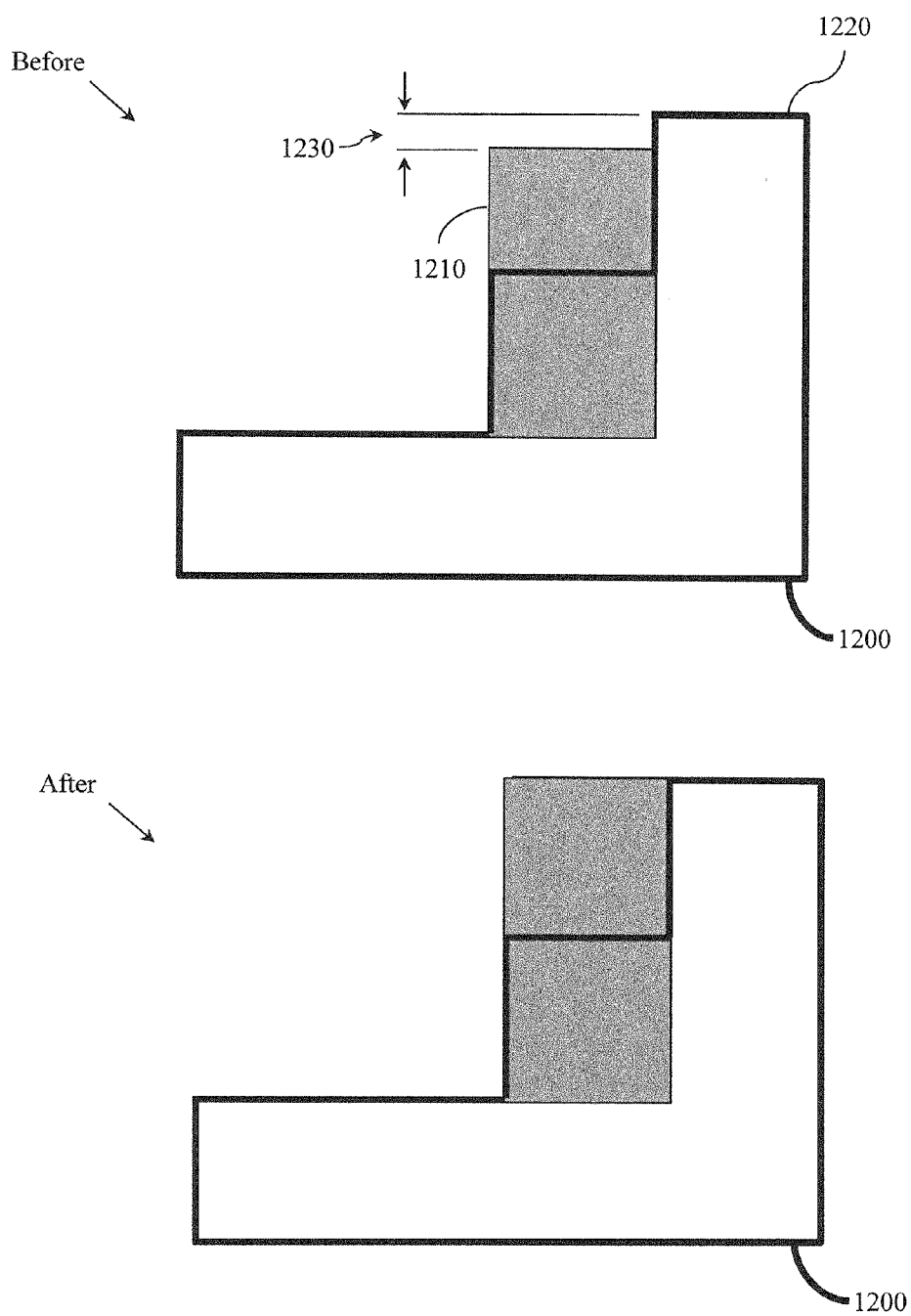
Figure 13:
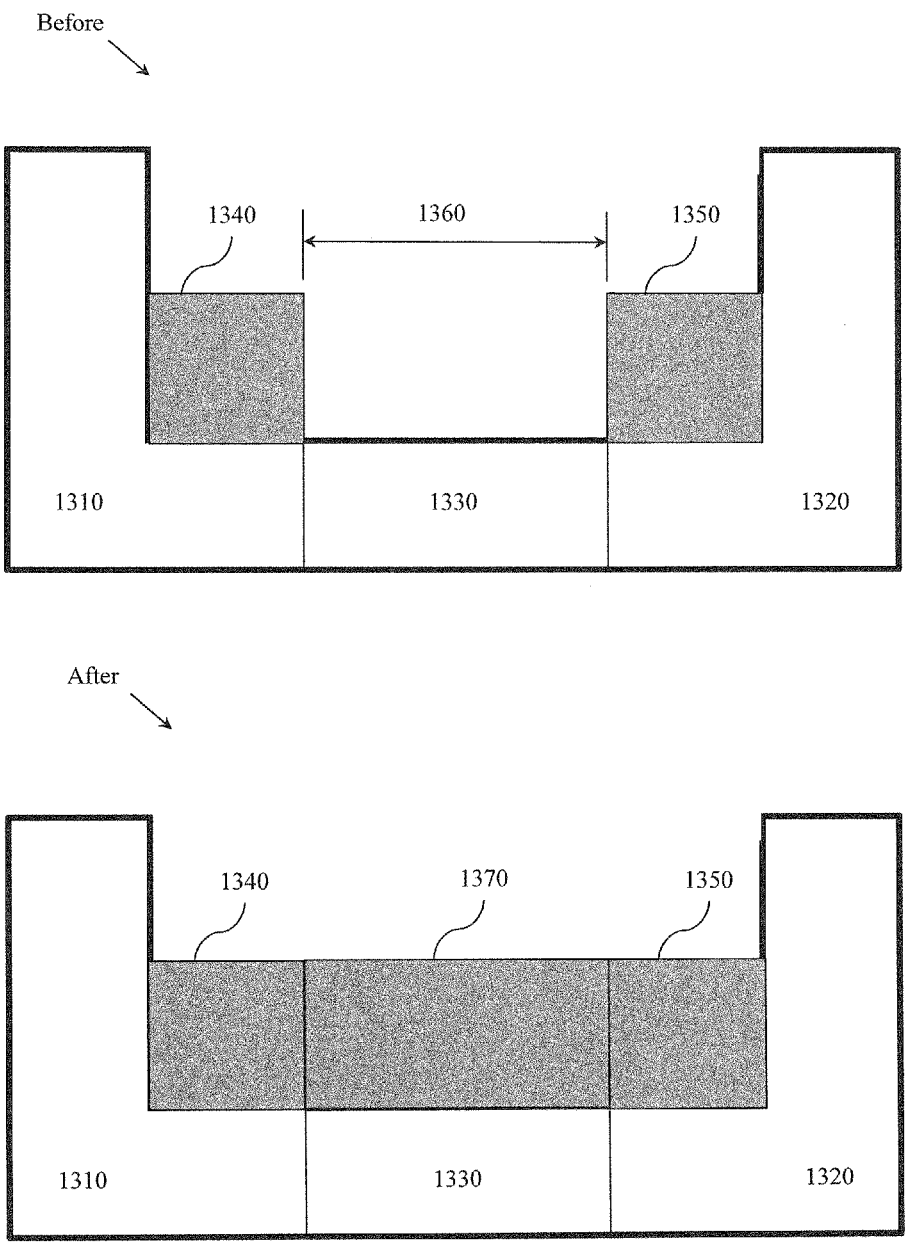

Additionally, consider FIG. 12, which illustrates a bounded region of metal 1200 with a jog patch 1210. The jog patch 1210 extends just short of an edge 1220 by a portion 1230, which causes an additional jog violation along the top of the jog patch 1210 and at an edge created by the short portion 1230. Accordingly, at 360, the jog patch 1210 is extended by an additional amount equal to the portion 1230 to make the jog patch 1210 even with the edge 1220. In this way, the new DRC error is avoided while still patching the jog violation.

FIG. 13 illustrates another example of a DRC error generated by two jog patches. In FIG. 13 two separate regions of metal 1310 and 1320 are connected by a region 1330. Jog patches 1340 and 1350 have generated a gap 1360. Accordingly, at 360 of method 300, the jog patches 1340 and 1350 are connected by an additional patch 1370 to correct the DRC error.

After the patches have been dynamically generated from the virtual edges and checked for new DRC errors, the design is transformed at 370 by using the jog patches. That is, the device transforms the design of the metal at the jog rule violation using the jog patch. In one embodiment, transforming the design of the metal adds metal to the design to correct the jog rule violation. In general, at 370, the design is modified to include the jog patch as a seamless portion of the metal. In this way, jog violations are corrected in a single execution of a process without iteratively applying pre-defined jog patches.

Figure 14:
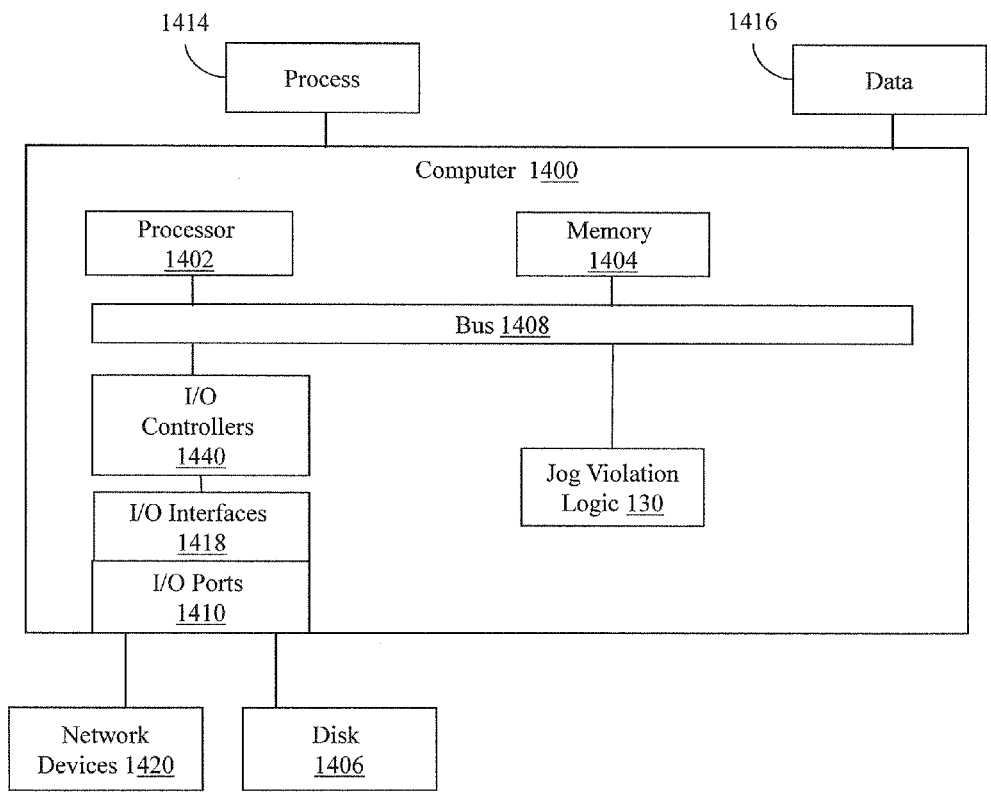
FIG. 14 illustrates an embodiment of a computing system in which example systems and methods, and equivalents, may operate.

FIG. 14 illustrates an example computing device that is configured and/or programmed with one or more of the example systems and methods described herein, and/or equivalents. The example computing device may be a computer 1400 that includes a processor 1402, a memory 1404, and input/output ports 1410 operably connected by a bus 1408. In one example, the computer 1400 may include jog violation logic 1430 that is configured to facilitate dynamically generating jog patches to correct jog violations similar to logics 210, 220 and 230 as shown in FIG. 2. In different examples, the logic 1430 may be implemented in hardware, a non-transitory computer-readable medium with stored instructions, firmware, and/or combinations thereof. While the logic 1430 is illustrated as a hardware component attached to the bus 1408, it is to be appreciated that in one example, the logic 1430 could be implemented in the processor 1402.

Generally describing an example configuration of the computer 1400, the processor 1402 may be a variety of various processors including dual microprocessor and other multi-processor architectures. A memory 1404 may include volatile memory and/or non-volatile memory. Non-volatile memory may include, for example, ROM, PROM, and so on. Volatile memory may include, for example, RAM, SRAM, DRAM, and so on.

A disk 1406 may be operably connected to the computer 1400 via, for example, an input/output interface (e.g., card, device) 1418 and an input/output port 1410. The disk 1406 may be, for example, a magnetic disk drive, a solid state disk drive, a floppy disk drive, a tape drive, a Zip drive, a flash memory card, a memory stick, and so on. Furthermore, the disk 1406 may be a CD-ROM drive, a CD-R drive, a CD-RW drive, a DVD ROM, and so on. The memory 1404 can store a process 1414 and/or a data 1416, for example. The disk 1406 and/or the memory 1404 can store an operating system that controls and allocates resources of the computer 1400.

The bus 1408 may be a single internal bus interconnect architecture and/or other bus or mesh architectures. While a single bus is illustrated, it is to be appreciated that the computer 1400 may communicate with various devices, logics, and peripherals using other busses (e.g., PCIE, 1394, USB, Ethernet). The bus 1408 can be types including, for example, a memory bus, a memory controller, a peripheral bus, an external bus, a crossbar switch, and/or a local bus.

The computer 1400 may interact with input/output devices via the i/o interfaces 1418 and the input/output ports 1410. Input/output devices may be, for example, a keyboard, a microphone, a pointing and selection device, cameras, video cards, displays, the disk 1406, the network devices 1420, and so on. The input/output ports 1410 may include, for example, serial ports, parallel ports, and USB ports.

The computer 1400 can operate in a network environment and thus may be connected to the network devices 1420 via the i/o interfaces 1418, and/or the i/o ports 1410. Through the network devices 1420, the computer 1400 may interact with a network. Through the network, the computer 1400 may be logically connected to remote computers. Networks with which the computer 1400 may interact include, but are not limited to, a LAN, a WAN, and other networks.

In another embodiment, the described methods and/or their equivalents may be implemented with computer executable instructions. Thus, in one embodiment, a non-transitory computer-readable medium is configured with stored computer executable instructions that when executed by a machine (e.g., processor, computer, and so on) cause the machine (and/or associated components) to perform the method.

While for purposes of simplicity of explanation, the illustrated methodologies in the figures are shown and described as a series of blocks, it is to be appreciated that the methodologies (e.g., method 300 of FIG. 3) are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, is a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read. Computer-readable medium described herein are limited to statutory subject matter under 35 U.S.C §101.

"Logic", as used herein, includes a computer or electrical hardware component(s), firmware, a non-transitory computer readable medium that stores instructions, and/or combinations of these components configured to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions that when executed perform an algorithm, and so on. Logic may include one or more gates, combinations of gates, or other circuit components. Where multiple logics are described, it may be possible to incorporate the multiple logics into one physical logic component. Similarly, where a single logic unit is described, it may be possible to distribute that single logic unit between multiple physical logic components. Logic as described herein is limited to statutory subject matter under 35 U.S.C §101.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

What is claimed is:

1. A non-transitory computer-readable medium storing computer-executable instructions that when executed by a computer cause the computer to perform a method, the method comprising:
   identifying a jog rule violation in a design for an integrated circuit, wherein the jog rule violation includes a first edge and a second edge that are consecutive edges of metal in a metal layer of the design;
   determining a virtual edge within the metal from which to expand an area of the metal, wherein the virtual edge is an edge of a rectangle associated with one or more edges of the jog rule violation;
   dynamically generating a jog patch by expanding the metal from the virtual edge; and
   transforming the design of the metal at the jog rule violation using the jog patch, wherein determining the virtual edge when the jog rule violation is concave includes:
      determining an abutting edge of the metal that abuts the first edge, wherein the first edge is aligned in a routing direction of the metal and the abutting edge is perpendicular to the routing direction, wherein the abutting edge is a third consecutive edge of the metal that is not the first edge or the second edge of the jog rule violation; and
      identifying the virtual edge from a bounding box as an edge of the bounding box opposite to the abutting edge, wherein the bounding box is defined by the abutting edge and the first edge.

2. The non-transitory computer-readable medium of claim 1, wherein identifying the jog rule violation includes analyzing the first edge to determine whether a length of the first edge is less than a first predefined length and determining whether the second edge is less than a second predefined length, wherein the second predefined length is greater than the first predefined length, wherein the virtual edge is a reference line within the metal that defines one side of the rectangle within the metal, and wherein the rectangle includes at least one of the first edge and the second edge as additional sides.

3. The non-transitory computer-readable medium of claim 2, wherein generating a jog patch by expanding the metal from the virtual edge includes expanding the metal according to the second predefined length from the virtual edge.

4. The non-transitory computer-readable medium of claim 1, wherein identifying the jog rule violation includes determining whether the jog rule violation is a convex jog rule violation or a concave jog rule violation.

5. The non-transitory computer-readable medium of claim 1,
   wherein determining the abutting edge when the jog rule violation is concave includes extending the first edge within the metal to determine the abutting edge of the metal that abuts the first edge,
   wherein determining the virtual edge when the jog rule violation is concave includes extending the abutting edge within the metal to determine the bounding box that is defined by the extended first edge and the extended abutting edge, and wherein the bounding box is disposed within the metal.

6. The non-transitory computer-readable medium of claim 1, wherein determining the virtual edge when the jog rule violation is convex includes:
   extending the first edge and the second edge within the metal to determine a bounding box that is defined by the extended first edge and the extended second edge, and
   identifying the virtual edge from the bounding box as an edge of the bounding box that is opposite to the first edge or the second edge and is within the metal.

7. The non-transitory computer-readable medium of claim 1, wherein transforming the design of the metal adds metal to the design to correct the jog rule violation.

8. The non-transitory computer-readable medium of claim 1, wherein determining the virtual edge includes determining whether the first edge or the second edge is parallel to the routing direction and determining the virtual edge from an edge that is parallel to the routing direction.

9. The non-transitory computer-readable medium of claim 1, further comprising:
   determining, prior to transforming the design using the jog patch, whether the jog patch causes a design rule check violation, wherein when the jog patch causes a violation the jog patch is re-generated by selecting a different virtual edge according to an edge that is perpendicular to the routing direction or the jog patch is modified to avoid causing the violation.

10. A computing system, comprising:
   check logic configured to identify a jog rule violation in a design for an integrated circuit, wherein the jog rule violation includes a first edge and a second edge that are consecutive edges of metal in a metal layer of the design;
   edge logic configured to determine a virtual edge within the metal from which to expand an area of the metal, wherein the virtual edge is an edge of a rectangle associated with one or more edges of the jog rule violation, wherein the edge logic is configured to determine the virtual edge when the jog rule violation is concave by:
      determining an abutting edge of the metal that abuts the first edge, wherein the first edge is aligned in a routing direction of the metal and the abutting edge is perpendicular to the routing direction, wherein the abutting edge is a third consecutive edge of the metal that is not the first edge or the second edge of the jog rule violation; and
      identifying the virtual edge from a bounding box as an edge of the bounding box opposite to the abutting edge, wherein the bounding box is defined by the abutting edge and the first edge; and
   patch logic configured to:
      dynamically generate a jog patch by expanding the metal from the virtual edge, and transform the design of the metal at the jog rule violation using the jog patch.

11. The computing system of claim 10, wherein the check logic is configured to identify the jog rule violation by analyzing the first edge to determine whether a length of the first edge is less than a first predefined length and determining whether a length of the second edge is less than a second predefined length, wherein the second predefined length is greater than the first predefined length, wherein the virtual edge is a reference line within the metal that defines one side of the rectangle within the metal, and wherein the rectangle includes at least one of the first edge and the second edge as additional sides.

12. The computing system of claim 11, wherein the patch logic is configured to dynamically generate the jog patch by expanding the metal from the virtual edge according to the second predefined length, and wherein the patch logic is configured to dynamically generate the jog patch by generating the jog patch in real-time as part correcting a plurality of jog violations.

13. The computing system of claim 10, wherein the edge logic is configured to determine the virtual edge when the jog rule violation is convex by:
    extending the first edge and the second edge within the metal to determine a bounding box that is defined by the extended first edge and the extended second edge, and
    identifying the virtual edge from the bounding box as one edge of the bounding box that is opposite to the first edge or the second edge.

14. The computing system of claim 10 wherein the edge logic is configured to determine the abutting edge when the jog rule violation is concave by extending the first edge within the metal to determine an abutting edge of the metal that abuts the first edge, and
    wherein the edge logic is configured to determine the virtual edge when the jog rule violation is concave by extending the abutting edge within the metal to determine the bounding box that is defined by the extended first edge and the extended abutting edge.

15. The computing system of claim 10, wherein the patch logic is configured to transform the design of the metal by adding metal to the design to correct the jog rule violation, and wherein the edge logic is configured to determine the virtual edge by determining whether the first edge or the second edge is parallel to the routing direction and determining the virtual edge from an edge that is parallel to the routing direction.

16. A computer-implemented method, comprising:
    identifying, by a processor, a jog rule violation in a design by analyzing consecutive edges of a metal structure in the design to determine whether two edges of the consecutive edges satisfy conditions for causing the jog rule violation, wherein the design is a design of an integrated circuit, and wherein the two edges are consecutive edges of the metal structure in a metal layer of the design;
    determining, by the processor, a virtual edge at the jog rule violation, wherein the virtual edge is enclosed within the metal structure, and wherein the virtual edge is an edge of a rectangle associated with at least one of the two edges that form the jog rule violation; and
    dynamically generating, by the processor, a jog patch by expanding the metal structure from the virtual edge to alter at least one of the two edges, wherein the virtual edge is not an edge of a bounding box formed from both of the two edges that form the jog rule violation when the jog rule violation is concave.

17. The computer-implemented method of claim 16, further comprising:
    determining, prior to transforming the design using the jog patch, whether the jog patch causes a design rule check violation, wherein when the jog patch causes a design rule check violation the jog patch is modified to avoid causing the design rule check violation.

18. The computer-implemented method of claim 16, wherein the conditions for causing the jog rule violation include a first edge having a length that is less than a first predefined length and a second edge having a length that is less than a second predefined length, wherein the first edge and the second edge are consecutive edges, wherein the second predefined length is greater than the first predefined length, and wherein the first length is less than a design width for metal routes in the metal layer.

19. The computer-implemented method of claim 16, wherein dynamically generating the jog patch by expanding the metal structure from the virtual edge includes expanding the metal structure according to a predefined length that avoids the conditions for causing the jog violation, and wherein dynamically generating the jog patch includes generating the jog patch in real-time as part of correcting a plurality of jog violations.

20. A non-transitory computer-readable medium storing computer-executable instructions that when executed by a computer cause the computer to perform a method, the instructions comprising instructions for:
    identifying, by a processor, a jog rule violation in a design by analyzing consecutive edges of a metal structure in the design to determine whether two edges of the consecutive edges satisfy conditions for causing the jog rule violation, wherein the design is a design of an integrated circuit, and wherein the two edges are consecutive edges of the metal structure in a metal layer of the design;
    determining, by the processor, a virtual edge at the jog rule violation, wherein the virtual edge is enclosed within the metal structure, and wherein the virtual edge is an edge of a rectangle associated with at least one of the two edges that form the jog rule violation; and
    dynamically generating, by the processor, a jog patch by expanding the metal structure from the virtual edge to alter at least one of the two edges, wherein the virtual edge is not an edge of a bounding box formed from both of the two edges that form the jog rule violation when the jog rule violation is concave.

* * * * *

UNITED STATES PATENT AND TRADEMARK OFFICE
CERTIFICATE OF CORRECTION

PATENT NO.       : 8,984,449 B1  
APPLICATION NO.  : 14/027329  
DATED            : March 17, 2015  
INVENTOR(S)      : Li Page 1 of 1

It is certified that error appears in the above-identified patent and that said Letters Patent is hereby corrected as shown below:

Title page, column 2, under Attorney, Agent or Firm, delete "Kraguliac" and insert -- Kraguljac --, therefor.

Signed and Sealed this  
First Day of September, 2015

Michelle K. Lee  
*Director of the United States Patent and Trademark Office*